United States Patent
Hu et al.

(10) Patent No.: US 6,413,802 B1
(45) Date of Patent: Jul. 2, 2002

(54) FINFET TRANSISTOR STRUCTURES HAVING A DOUBLE GATE CHANNEL EXTENDING VERTICALLY FROM A SUBSTRATE AND METHODS OF MANUFACTURE

(75) Inventors: Chenming Hu, Alamo; Tsu-Jae King, Fremont; Vivek Subramanian, Redwood City; Leland Chang, Berkeley; Xuejue Huang; Yang-Kyu Choi, both of Albany; Jakub Tadeusz Kedzierski, Hayward; Nick Lindert, Berkeley; Jeffrey Bokor, Oakland, all of CA (US); Wen-Chin Lee, Beaverton, OR (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/695,532

(22) Filed: Oct. 23, 2000

(51) Int. Cl.⁷ .......................... H01L 21/00; H01L 21/84
(52) U.S. Cl. ....................... 438/151; 438/283
(58) Field of Search .......................... 438/151, 157, 438/201, 223, 241, 258, 279, 283, 437, 588, 594, 259, 270, 303, 305, 589, 592

(56) References Cited

U.S. PATENT DOCUMENTS

| | | | |
|---|---|---|---|
| 5,356,824 A | | 10/1994 | Chouan et al. ............... 437/41 |
| 5,604,368 A | * | 2/1997 | Taur et al. ................... 257/348 |
| 5,646,058 A | * | 7/1997 | Taur et al. ................... 438/283 |
| 5,773,331 A | | 6/1998 | Solomon et al. ............ 438/164 |
| 5,804,848 A | | 9/1998 | Mukai ........................ 257/270 |
| 5,899,710 A | | 5/1999 | Mukai ........................ 438/156 |
| 6,214,670 B1 | * | 4/2001 | Shih et al. ................... 438/259 |

OTHER PUBLICATIONS

V. Subramanian et al., "A Bulk-Si-compatible Ultrathin-body SOI Technology for sub-100nm MOSFETS," Proceedings of the 57th Annual Device Research Conference, pp. 28–29 (1999).

Hisamoto et al., "A Folded-channel MOSFET for Deepsub--tenth Micron Era," 1998 IEEE International Electron Device Meeting Technical Digest, pp. 1032–1034 (1998).

Huang et al., "Sub 50–nm FinFET: PMOS," 1999 IEEE International Electron Device Meeting Technical Digest, pp. 67–70 (1999).

Auth et al., Vertical, Fully-Depleted, Surrounding Gate MOSFETS on sub-0.1μm Thick Silicon Pillars, 1996 54th Annual Device Research Conference Digest, pp. 108–109 (1996).

Hisamoto et al., "A Fully Depleted Lean–Channel Transistor (DELTA)—A Novel Vertial Ultrathin SOI MOSFET," IEEE Electron Device Letters, v. 11(1), pp. 36–38 (1990).

(List continued on next page.)

*Primary Examiner*—David Nelms
*Assistant Examiner*—Phuc T. Dang
(74) *Attorney, Agent, or Firm*—Townsend and Townsend and Crew LLP; Henry K. Woodward (57) ABSTRACT

A FinFET device is fabricated using conventional planar MOSFET technology. The device is fabricated in a silicon layer overlying an insulating layer (e.g., SIMOX) with the device extending from the insulating layer as a fin. Double gates are provided over the sides of the channel to provide enhanced drive current and effectively suppress short channel effects. A plurality of channels can be provided between a source and a drain for increased current capacity. In one embodiment two transistors can be stacked in a fin to provide a CMOS transistor pair having a shared gate.

28 Claims, 4 Drawing Sheets

OTHER PUBLICATIONS

Leobandung et al., "Wire–channel and wrap–around–gate metal–oxide–semiconductor field–effect transistors with a significant reduction of short channel effects," J. Vac. Sci. Technol. B 15(6), pp. 2791–2794 (1997).

Auth et al., Vertical, Fully–Depleted, Surrounding Gate MOSFETS on sub–0.1$\mu$m Thick Silicon Pillars, 1996 54th Annual Device Research Conference Digest, pp. 108–109 (1996).

* cited by examiner

FINFET TRANSISTOR STRUCTURES HAVING A DOUBLE GATE CHANNEL EXTENDING VERTICALLY FROM A SUBSTRATE AND METHODS OF MANUFACTURE

STATEMENT AS TO RIGHTS TO INVENTIONS MADE UNDER FEDERALLY SPONSORED RESEARCH AND DEVELOPMENT

The U.S. government has rights to the invention pursuant to DARPA Contract No. N66001-97-1-8910 with the University of California.

BACKGROUND OF THE INVENTION

This invention relates generally to FET and MOSFET transistors, and more particularly the invention relates to field effect transistors having channel regions extending vertically from a supporting substrate between horizontally disposed source and drain regions.

Metal-Oxide-Semiconductor field effect transistor (MOSFET) technology is the dominant electronic device technology in use today. Performance enhancement between generations of devices is generally achieved by reducing the size of the device, resulting in an enhancement in device speed. This is generally referred to as device "scaling". As MOSFETs are scaled to channel lengths below 100 nm, conventional MOSFETs suffer from several problems. In particular, interactions between the source and drain of the MOSFET degrade the ability of the gate of the same to control whether the device is on or off. This phenomenon is called the "short-channel effect". Silicon-on-insulator (SOI) MOSFETs are formed with an insulator (usually, but not limited to, silicon dioxide) below the device active region, unlike conventional "bulk" MOSFETs, which are formed directly on silicon substrates, and hence have silicon below the active region. SOI is advantageous since it reduces unwanted coupling between the source and the drain of the MOSFET through the region below the channel. This is often achieved by ensuring that all the silicon in the MOSFET channel region can be either inverted or depleted by the gate (called a fully depleted SOI MOSFET). As device size is scaled, however, this becomes increasingly difficult, since the distance between the source and drain is reduced, and hence, they increasing interact with the channel, reducing gate control and increasing short channel effects (SCE).

The double-gate MOSFET structure is promising since it places a second gate in the device, such that there is a gate on either side of the channel. This allows gate control of the channel from both sides, reducing SCE. Additionally, when the device is turned on using both gates, two conduction ("inversion") layers are formed, allowing for more current flow. An extension of the double-gate concept is the "surround-gate" or "wraparound-gate" concept, where the gate is placed such that it completely or almost-completely surrounds the channel, providing better gate control.

Leobandung et al. and J. Vac. Sci. Technol. B 15(6), November/December 1997, pp. 2791–2794 disclose a wire channel and wraparound gate metal oxide semiconductor field effect transistor. In this structure spaced source and drain regions support a silicon "wire" above a substrate with a four-sided gate surrounding the wire channel region. The suspended channel region limits the device dimensions and the four-sided wraparound gate is prone to comer effects and mobility degradation due to electric fields penetrating the channel from all directions.

Hisamoto et al. IEDM 98, pp. 1032–1034 and Huang et al. IEDM 97, pp. 67–70 disclose FinFET structures in which the channels are first formed and then source and drain regions are formed by a silicon deposition process. This results in source and drain which are necessarily taller than the channel fin, and the gate length is defined by using an oxide spatial process to create a gap between the tall source and drain islands. This gap is then filled with gate material such as the gate straddles the fin and forms a double gate device. Thus in this structure the channel link is defined by the spacer definition process rather than by lithographic patterning, requiring a complicated process.

The present invention is directed to a process for fabricating FinFET transistor structures which is an extension of conventional planar MOSFET technology and resulting structures.

SUMMARY OF THE INVENTION

In accordance with the invention a method is provided for fabricating a double gate field effect transistor (FinFET) which is compatible with conventional MOSFET fabrication processes. The device channel comprises a thin silicon fin standing on an insulative layer (e.g. silicon oxide) with the gate overlying the sides of the fin. Thus inversion layers are formed on the sides of the channel with the channel film being sufficiently thin such that the two gates control the entire channel film and limit modulation of channel conductivity by the source and drain. In a preferred embodiment, the thickness of the film is chosen such that it is less or equal to $7/10$ths of the channel length. In most implementations the channel film width is less than the channel length such that the channel of the device resembles a long thin film.

The double gates on the channel fin effectively suppress SCE and enhance drive current. In some embodiments, a plurality of channels can be provided between source and drain regions and since the channel is thin and the fins are parallel, vertical fields are reduced thereby reducing the degradation and mobility typically caused by vertical fields. Further, since the fin is thin, doping of the fin is not required to suppress SCE and undoped silicon can be used as the device channel, thereby reducing mobility degradation due to impurity scattering. Further, the threshold voltage of the device may be controlled by adjusting the work function of the gate by using a silicon-germanium alloy or a refractory metal or its compound such as titanium nitride.

In an alternative embodiment of the invention, stacked transistors can be provided with a single gate overlapping the channel fins of the transistors.

The invention and objects and features thereof will be more readily apparent from the following detailed description and appended claims when taken with the drawings.

DETAILED DESCRIPTION OF ILLUSTRATED EMBODIMENTS

Figure 1:
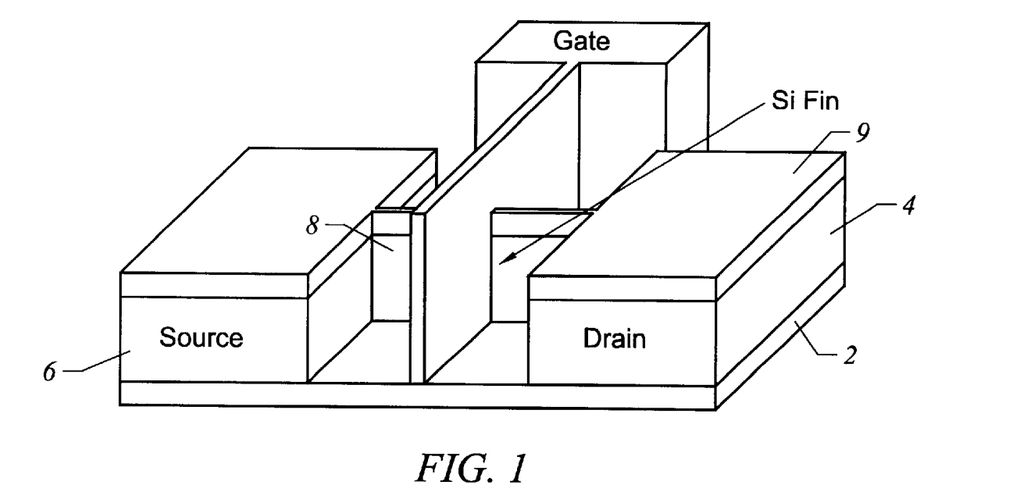
FIG. 1 is a perspective view of a FinFet device make in accordance with an embodiment of the invention.

Referring now to the drawing, FIG. 1 illustrates in perspective a FinFET transistor in accordance with an embodiment of the present invention. In this embodiment, the device is fabricated on insulative layer 2 (e.g. SIMOX) and includes a silicon drain island 4 and a source island 6 connected by a silicon fin or channel 8. The source, drain, and channel are covered by a dielectric layer 9 (hard mask), and a gate extends across the channel fin 8 and is isolated therefrom by gate oxide and the hard mask 9. The channel extends horizontally on the substrate 2 with the gates in planes on either side of the channel. Thus, inversion layers are formed on both sides of the channel. The structure has the advantage of providing double gates to effectively suppress SCE and enhance drive current. Since the channels are parallel planes, there is no problem with corner effects, and since the fin is very thin, doping of the fin is not required to suppress SCE. The threshold voltage of the device can be controlled by adjusting the work function of the gate, for example, by using silicon-germanium alloy or a refractory metal or is compound such as titanium nitride.

Figure 2A:
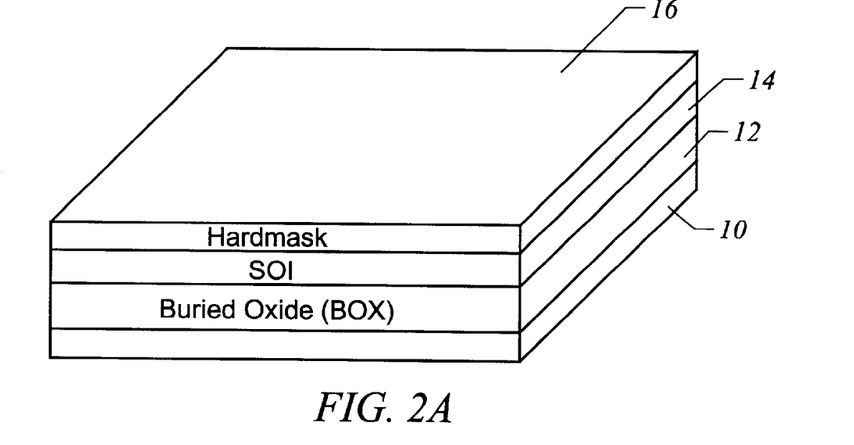
FIGS. 2(a)–2(f) are perspective views illustrating steps and fabricating a double gate FinFET device in accordance an embodiment of the invention.

FIGS. 2A–2F are perspective views illustrating steps in fabricating a double gate MOSFET device in accordance with one embodiment of the invention. In FIG. 2A, a substrate such as a silicon on insulator (SOI) SIMOX structure is provided including a silicon substrate 10, a buried oxide layer 12, and a silicon layer 14 on the buried oxide. The width of the transistor is effectively defined by the thickness of silicon layer 14 since the device width, upon inclusion of the double channels, is twice the SOI film thickness. On the exposed major surface of silicon layer 14 is formed a hard mask 16 of an insulating layer such as silicon oxide, silicon nitride, a low dielectric constant material, or other suitable etchant insulator which allows the use of aggressive etch chemistries such as plasma etching.

Figure 2B:
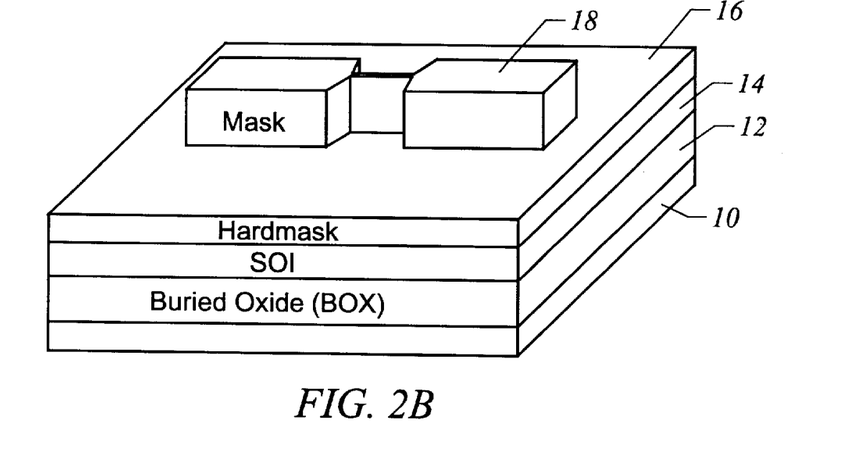

After the hard mask deposition, a photoresist is applied to the hard mask to define a pattern through use of optical lithography, electron beam lithography, x-ray lithography, or other conventional means to produce a chemical etchant mask 18 as shown in FIG. 2B. The orientation of mask 18 (and the underlying Fin to be etched) on the surface of the wafer relative to the crystallographic orientation of the silicon material may be chosen to enhance electrical properties of the device such as carrier mobility. A 1-0-0 crystallographic orientation on the surface provides highest mobility.

Figure 2C:
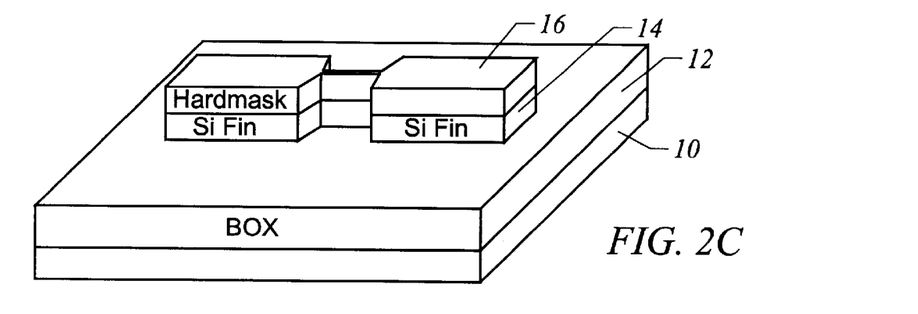
Figure 2D:
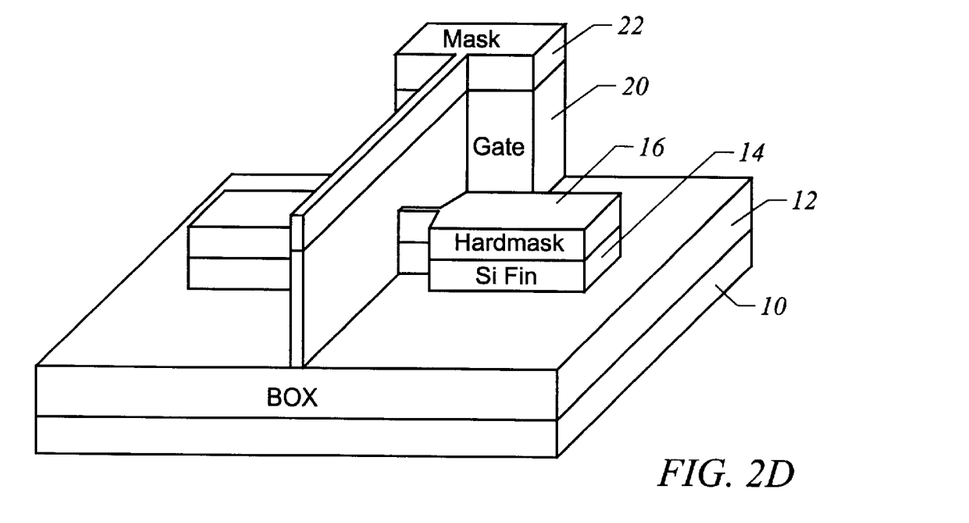

After the mask definition, an etch process is used to pattern the hard mask and the device fin structure, and thereafter the lithographic mask is removed as shown in FIG. 2C. At this point, a sacrificial oxidation process may be used to repair any damage done to the Fin surface during the etch process. Oxidation may also be used to reduce the Fin width, thereby allowing sublithographic dimensions to be achieved. The oxide is then stripped to expose the thin, clean Fin and a gate dielectric is grown or deposited thereon. This may be thermally grown silicon oxide or deposited silicon oxide, silicon nitride, a high dielectric constant material, or other dielectric insulator which is suitable for use as a gate dielectric. Next, gate material is deposited over the surface which can be polysilicon, silicon-germanium, a refractory metal or compounds such as titanium nitride or molybdenum, or other suitable conductive material. As shown in FIG. 2D, gate mask 22 is defined and then the underlying gate material is etched to form gate 20 with the etching stopping on the gate oxide and the insulator layer 12. Gate 20 is electrically isolated from the transistor structure by the gate oxide and the hard mask 16 overlying the transistor structure.

Figure 2E:
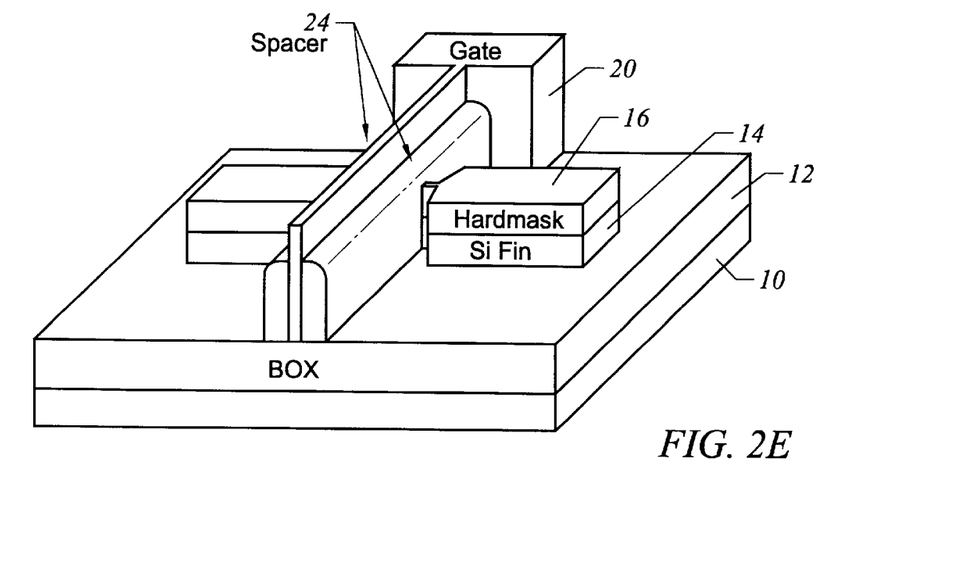

After definition of gate 20, masking material 22 can be stripped. At this point, a light implant of appropriate dopants may be used to form a lightly doped drain (LDD) or extension region. Next, a spacer is formed on the sidewalls of the gate and the channel by deposition and selective etching of a dielectric such as silicon nitride or silicon dioxide. The spacer on the sidewalls of the channel can be removed if desired by using an additional etching leaving gate spacers 24 on either side of gate 20 as shown in FIG. 2E.

Figure 2F:
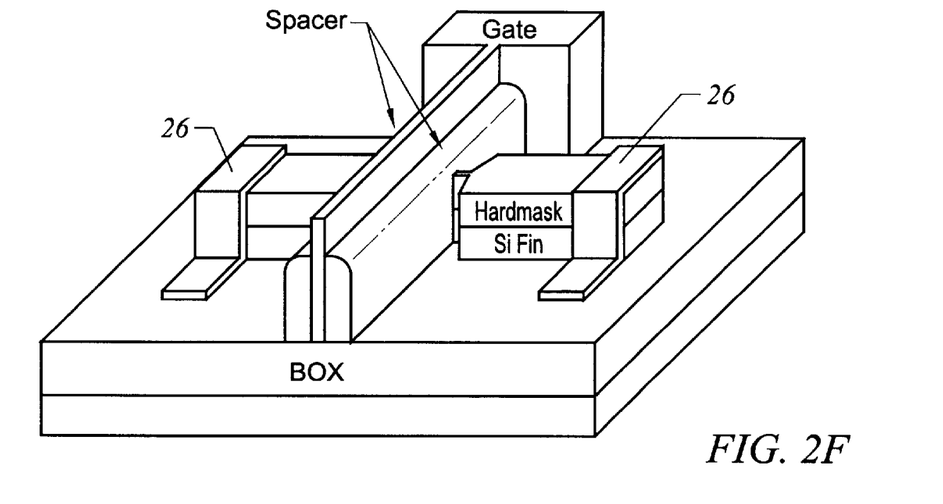

After spacer formation, the hard mask 16 over the source and drain can be removed to enable direct access to the underlying source and drain material. This can be achieved by anisotropically etching the hard mask such that it is removed over the source and drain islands. Doping of the source and drain regions make them electrically conductive. The gate may also be doped at this step if necessary. Doping may be accomplished by high end implantation, gas immersion laser doping, ion shower doping, solid or gas source diffusion, or other conventional means. The dopant species is chosen to achieve the required device characteristics, either N-type or P-type, including dopant concentrations. Angled shallow ion implantation may be used to dope the sides and top of the source and drain regions without completely amorphizing them, as could result with a deeper vertical ion implant. Any implant damage or amorphization can be annealed through subsequent exposure to elevated temperatures. The resistance of the source and drain can also be reduced by strapping the source/drain with a conductive material 26 as shown in FIG. 2F. This can be a self-aligned silicide process, or other selective conductor deposition such as selective metal, polysilicon, or epitaxial silicon deposition. By removing the hard mask from over the source and drain islands while leaving the spacers on the edges of the source and drain islands and the gate, it is possible to use a number of selective or self-aligned conductor formation techniques to reduce the resistance of the source and drain islands without electrically shorting the source and drain islands to the gate. This can be implemented using a self-aligned silicide technology, for example. The process can make use of silicides that consume small amounts of silicon, such as nickel silicide or palladium silicide. Other possible suicides include titanium silicide and cobalt silicide. In an alternative implementation, the hard mask and source and drain spacers can be removed thereby allowing strapping of the entire source and drain with low resistance conductors and further reducing parasitic resistances.

Figure 3:
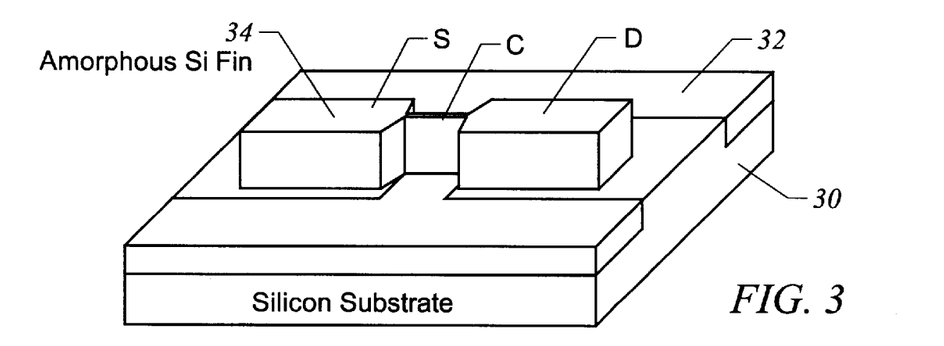
FIG. 3 is a perspective view illustrating an alternative embodiment of the invention employing epitaxial crystallization.

In an alternative embodiment, the method can use a deposited channel film rather than an SOI substrate channel film as in the above described embodiment. As illustrated in FIG. 3, the process can be integrated using a bulk silicon process and solid phase epitaxy. In FIG. 3, silicon substrate 30 is selectively etched and a planar silicon oxide layer 32 is grown on one surface. Amorphous silicon is then deposited overlying the silicon oxide film 32 and substrate 30 and then patterned as described above to define the transistor structure shown generally at 34. The source S, and drain D, can be epitaxially grown and the channel region, C, which was initially amorphous is epitaxially recrystallized from the source and drain regions. Other steps in the process in fabricating the gate structure and source and drain regions are the same as described above for FIG. 2.

Figure 4:
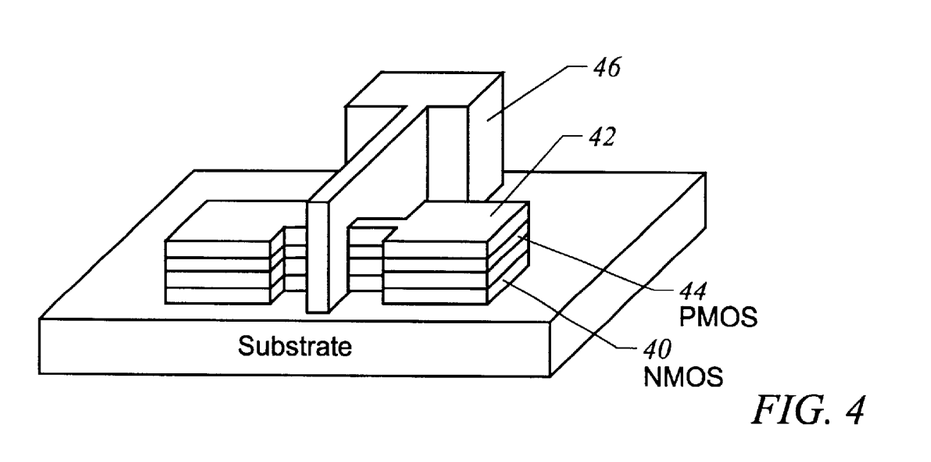
FIG. 4 is a perspective view illustrating a stacked FinFET device operating as a CMOS transistor pair.

In accordance with another embodiment of the invention as shown in FIGS. 4, the process of FIG. 2A–2F can be employed to fabricate vertically aligned NMOS transistor 40 and PMOS transistor 42 separated by a dielectric layer 44. A common gate 46 is provided over the channels of both transistors. This structure can be implemented using solid phase epitaxy or lateral epitaxial overgrowth using polycrystalline or amorphous silicon to form thin film transistor channel regions. The ratio of the NMOS and PMOS transistor widths can be adjusted by adjusting the ratio of the thicknesses of the semiconductor films.

Figure 5:
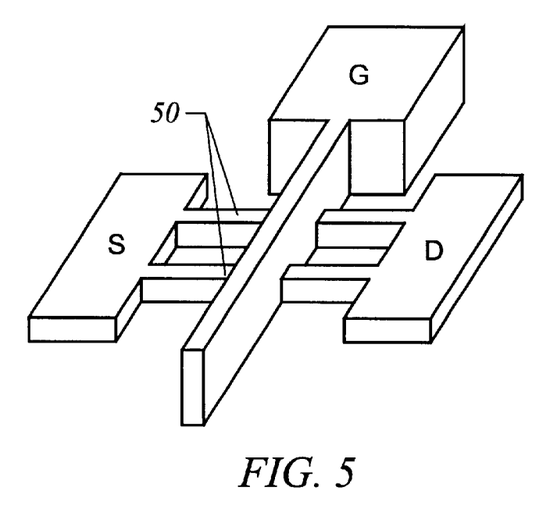
FIG. 5 is a perspective view of another embodiment of the invention having a plurality of channels between source and drain regions.

As noted above, the width of the FinFET device is defined by the thickness of the silicon film. Multiple device widths can be achieved on the same substrate by placing multiple fins in parallel as illustrated in FIG. 5. The Fins 50 can be defined lithographically or may be achieved by a spacer formation technique in which a sacrificial silicon body is formed, edges are oxidized and then the silicon is removed leaving the oxidized edges as the etchant mask in defining the fins. An advantage of this spacer technique is that the width of the Fin may be of sub lithographic dimensions. Further, the fin pitch is twice the lithographic pitch in fabricating the sacrificial silicon body, thus increasing achievable current density.

Figure 6:
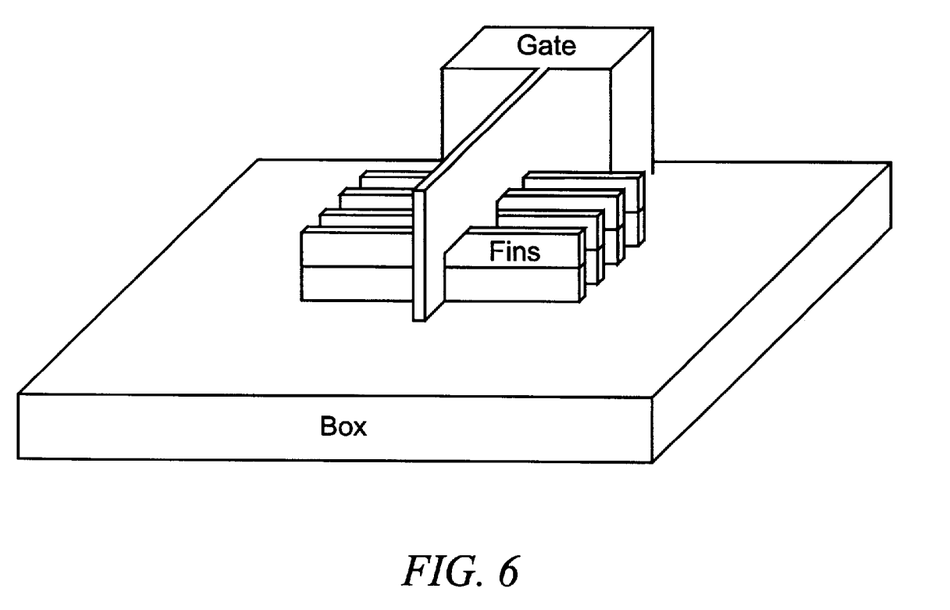
FIG. 6 is a perspective view illustrating a step in fabricating the device of FIG. 5 in accordance with an embodiment of the invention.

To further simplify lithographic concerns, the channels may be formed simply as a set of lines as shown in FIG. 6. Again, the spacer formation technique described above can be employed to reduce fin thickness and increase fin density. Since the pattern is then simply a series of lines and spacers, lithographic and non-lithographic techniques can be used aggressively. Source and drain islands may be added later in the process using subsequent deposition and etch steps to wrap the source and drain conductors around the edges of the channel fins. In another embodiment of the process, the channel film can be deposited on any suitable insulating substrate. The channel film can be formed from polycrystalline, microcrystalline, or amorphous silicon.

A FinFET structure in accordance with the invention not only reduces short channel effects, but also reduces leakage current through use of the double gates. The process is compatible with conventional planar MOSFET fabrication techniques and yields planar devices of smaller dimensions and increased density. While the invention has been described with reference to specific embodiments, the description is illustrative of the invention and is not to be considered as limiting the invention. Various modifications and applications may occur for those skilled in the art without departing from the true spirit and scope of the invention as defined by the appended claims.

What is claimed is:

1. A method of fabricating a double gate MOSFET device comprising the steps of:
    a) providing a silicon on insulator (SOI) substrate with a first silicon layer overlying an insulating layer and having an exposed major surface,
    b) providing an etchant mask on the major surface,
    c) patterning the etchant mask to define source, drain, and channel regions and expose surrounding portions of the silicon layer,
    d) etching the exposed silicon layer and forming source, drain, and channel regions extending from the insulator layer, the channel being a fin with a top surface and two opposing sidewalls,
    e) forming a gate dielectric on sidewalls of the channel region,
    f) depositing gate material over the etchant mask and the gate dielectric,
    g) selectively masking and etching the gate material to form a gate on the top surface and sidewalls of the channel region and separated from the channel region by the gate dielectric and the etchant mask,
    h) forming dielectric spacers between the gate and the source and drain regions, and
    i) doping the source and drain regions.

2. A method of fabricating a double gate MOSFET device comprising the steps of:
    a) providing a silicon on insulator (SOI) substrate with a first undoped silicon layer overlying an insulating layer and having an exposed major surface,
    b) providing an etchant mask on the major surface,
    c) patterning the etchant mask to define source, drain, and channel regions and expose surrounding portions of the silicon layer,
    d) etching the exposed silicon layer and forming source, drain, and channel regions extending from the insulator layer,
    e) forming a gate dielectric on sidewalls of the channel region,
    f) depositing gate material over the etchant mask and the gate dielectric,
    g) selectively masking and etching the gate material to form a gate on the sidewalls of the channel region and separated from the channel region by the gate dielectric and the etchant mask,
    h) forming dielectric spacers between the gate and the source and drain regions, and
    i) doping the source and drain regions.

3. The method as defined by claim 1 wherein the silicon layer is lightly doped.

4. A method of fabricating a double gate MOSFET device comprising the steps of:
    a) providing a silicon on insulator (SOI) substrate with a first silicon layer overlying an insulating layer and having an exposed major surface,
    b) providing an etchant mask on the major surface,
    c) patterning the etchant mask to define source, drain, and channel regions and expose surrounding portions of the silicon layer,
    d) etching the exposed silicon layer and forming source, drain, and channel regions extending from the insulator layer,
    e) forming a gate dielectric on sidewalls of the channel region,
    f) depositing gate material over the etchant mask and the gate dielectric,
    g) selectively masking and etching the gate material to form a gate on the sidewalls of the channel region and separated from the channel region by the gate dielectric and the etchant mask, and forming a lightly doped drain extension in the channel between the gate and the drain region,
    h) forming dielectric spacers between the gate and the source and drain regions, and
    i) doping the source and drain regions.

5. A method of fabricating a double gate MOSFET device comprising the steps of:
    a) providing a silicon on insulator (SOI) substrate with a first silicon layer overlying an insulating layer and having an exposed major surface,
    b) providing an etchant mask on the major surface,
    c) patterning the etchant mask to define source, drain, and channel regions and expose surrounding portions of the silicon layer, d) etching the exposed silicon layer and forming source, drain, and channel regions extending from the insulator layer, e) forming a gate dielectric on sidewalls of the channel region, f) depositing undoped polysilicon gate material over the etchant mask and the gate dielectric, g) selectively masking and etching the gate material to form a gate on the sidewalls of the channel region and separated from the channel region by the gate dielectric and the etchant mask, h) forming dielectric spacers between the gate and the source and drain regions, and i) doping the gate, source and drain regions.

6. The method as defined by claim 5 wherein step (i) includes angled shallow ion implantation to limit amorphizing of the source and drain regions.

7. The method as defined by claim 6 and further including the step of annealing the source and drain regions after ion implantation.

8. The method as defined by claim 7 and further including the step of:

j) applying conductive straps across and in contact with the source and drain regions.

9. The method as defined by claim 8 wherein step (j) includes removing the etchant mask from over the source and drain regions prior to applying conductive straps.

10. A method of fabricating a double gate MOSFET device comprising the steps of:

a) providing a silicon on insulator (SOI) substrate with a first silicon layer overlying an insulating layer and having an exposed major surface, b) providing an etchant mask on the major surface, c) patterning the etchant mask to define source, drain, and channel regions and expose surrounding portions of the silicon layer, d) etching the exposed silicon layer and forming source, drain, and channel regions extending from the insulator layer, e) forming a gate dielectric on sidewalls of the channel region, f) depositing gate material over the etchant mask and the gate dielectric, g) selectively masking and etching the gate material to form a gate on the sidewalls of the channel region and separated from the channel region by the gate dielectric and the etchant mask, h) forming dielectric spacers between the gate and the source and drain regions, and i) doping the source and drain regions by angled shallow ion implantation to limit amorphizing the source and drain regions.

11. The method as defined by claim 10 and further including the step of annealing the source and drain regions after ion implantation.

12. The method as defined by claim 11 and further including the step of:

j) applying conductive straps across and in contact with the source and drain regions.

13. The method as defined by claim 12 wherein step j) includes removing the etchant mask from over the source and drain regions prior to applying conductive straps.

14. A method of fabricating a double gate MOSFET device comprising the steps of:

a) providing a silicon on insulator (SOI) substrate with a first silicon layer overlying an insulating layer and having an exposed major surface, b) providing an etchant mask on the major surface, c) patterning the etchant mask to define source, drain, and channel regions and expose surrounding portions of the silicon layer, d) etching the exposed silicon layer and forming source, drain, and channel regions extending from the insulator layer, e) forming a gate dielectric on sidewalls of the channel region, f) depositing gate material over the etchant mask and the gate dielectric, g) selectively masking and etching the gate material to form a gate on the sidewalls of the channel region and separated from the channel region by the gate dielectric and the etchant mask, h) forming dielectric spacers between the gate and the source and drain regions, i) doping the source and drain regions, and j) applying conductive straps across and in contact with the source and drain regions.

15. The method as defined by claim 14 wherein step j) includes removing the etchant mask from over the source and drain regions prior to applying conductive straps.

16. The method as defined by claim 1 wherein step c) defines a plurality of channel regions between the source and drain regions.

17. A method of fabricating a double gate CMOS device comprising the steps of:

a) providing a silicon on insulator (SOI) substrate with a first silicon layer over a dielectric layer and having an exposed major surface, b) selectively doping regions of the first silicon layer to accommodate source and drain regions of a first transistor, c) forming a second dielectric layer over the first silicon layer, d) forming a second silicon layer over the second dielectric layer, e) providing an etchant mask over the second silicon layer, f) patterning the etchant mask to define source, drain, and channel regions of two stacked transistors including the first transistor, g) etching the first and second silicon layers and the first and second dielectric layers thereby forming source, drain, and channel regions of the two stacked transistors, h) forming a gate dielectric on sidewalls of the channel regions, i) depositing gate material over the etchant mask and the gate dielectric, j) selectively masking and etching the gate material to form a gate on the sidewalls of the channel regions separated from the channel regions by the gate dielectric and the etchant mask, and k) doping the source and drain regions in the second silicon layer.

18. A method of fabricating a double gate CMOS device comprising the steps of:

a) providing a silicon on insulator (SOI) substrate with a first silicon layer over a dielectric layer and having an exposed major surface, b) selectively doping regions of the first silicon layer to accommodate source and drain regions of a first transistor, c) forming a second dielectric layer over the first silicon layer, d) forming a second silicon layer over the second dielectric layer, e) providing an etchant mask over the second silicon layer, f) patterning the etchant mask to define source, drain, and channel regions of two stacked transistors, g) etching the first and second silicon layers and the first and second dielectric layers thereby forming source, drain, and channel regions of the two stacked transistors, h) forming a gate dielectric on sidewalls of the channel regions, i) depositing undoped polysilicon gate material over the etchant mask and the gate dielectric, j) selectively masking and etching the gate material to form a gate on the sidewalls of the channel regions separated from the channel regions by the gate dielectric and the etchant mask, and k) doping the gate, source and drain regions in the second silicon layer.

19. The method as defined by claim 18 wherein step k) includes angled shallow ion implantation to limit amorphizing of the source and drain regions.

20. The method as defined by claim 19 and further including the step of annealing the source and drain regions after ion implantation.

21. A double gate MOSFET device comprising:
a) a silicon substrate having a dielectric layer on a major surface,
b) a silicon source region and a silicon drain region with a channel region therebetween extending from the dielectric layer, the channel being a fin with a top surface and two opposing sidewalls,
c) a gate dielectric layer on sidewalls of the channel region and an etchant mask overlying a top of the channel region, and
d) a gate extending over the top and sidewalls of the channel region and electrically isolated therefrom by the gate dielectric and etchant mask.

22. A double gate MOSFET device comprising:
a) a silicon substrate having a dielectric layer on a major surface,
b) a silicon source region and a silicon drain region with a channel region therebetween extending from the dielectric layer,
c) a gate dielectric layer on sidewalls of the channel region and an etchant mask overlying a top of the channel region, the etchant mask being selected from the group consisting of silicon oxide, silicon nitride, and combinations thereof, and
d) a gate extending over the top and sidewalls of the channel region and electrically isolated therefrom by the gate dielectric and etchant mask.

23. The double gate MOSFET device as defined by claim 22 wherein the source region and the drain region are more heavily doped than is the channel region.

24. The double gate MOSFET device as defined by claim 23 wherein the drain region includes a lightly doped region extending to the channel region.

25. The double gate MOSFET device as defined by claim 23 and further including a plurality of channel regions between the source and the drain region.

26. A double gate MOSFET device comprising
a) a silicon substrate having a dielectric layer on a major surface,
b) a silicon source region and a silicon drain region with a plurality of channel regions between the source region and the drain region and extending from the dielectric layer,
c) a gate dielectric layer on sidewalls of the channel region and an etchant mask overlying a top of the channel region, and
d) a gate extending over the top and sidewalls of the channel region and electrically isolated therefrom by the gate dielectric and etchant mask.

27. A double gate CMOS device comprising:
a) a silicon substrate having a dielectric layer on a major surface,
b) a first silicon source region and a first silicon drain region with a first channel region therebetween extending from the dielectric layer,
c) a second silicon source region and a second silicon drain region with a second channel region therebetween overlying the first silicon source region and the first silicon drain region and the first channel region with a dielectric therebetween,
d) a gate dielectric on sidewalls of the channel regions and an etchant mask overlying a top of the second channel region, and
e) a gate extending over the top and sidewalls of the channel regions and electrically isolated therefrom by the gate dielectric and etchant mask.

28. The double gate CMOS device as defined by claim 27 wherein the first source and drain regions are of opposite conductivity type from the second source and drain regions.

* * * * *